(12) United States Patent
Wang (10) Patent No.: US 11,316,121 B2
(45) Date of Patent: Apr. 26, 2022

(54) FLEXIBLE LIGHT EMITTING DISPLAY PANEL, FLEXIBLE LIGHT EMITTING DISPLAY PANEL MANUFACTURING METHOD AND DISPLAY APPARATUS

(71) Applicant: Wuhan China Star Optoelectronics Semiconductor Display Technology Co., Ltd., Wuhan (CN)

(72) Inventor: Fang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 191 days.

(21) Appl. No.: 16/642,022

(22) PCT Filed: Nov. 18, 2019

(86) PCT No.: PCT/CN2019/119287
§ 371 (c)(1),
(2) Date: Feb. 26, 2020

(87) PCT Pub. No.: WO2021/042573
PCT Pub. Date: Mar. 11, 2021

(65) Prior Publication Data
US 2021/0066624 A1 Mar. 4, 2021

(30) Foreign Application Priority Data

Sep. 2, 2019 (CN) .......................... 201910822688.4

(51) Int. Cl.
*H01L 51/00* (2006.01)
*H01L 27/32* (2006.01)
*G02F 1/1333* (2006.01)
*G02F 1/1335* (2006.01)

(52) U.S. Cl.
CPC ...... *H01L 51/0097* (2013.01); *H01L 27/3232* (2013.01); *G02F 1/133305* (2013.01); *G02F 1/133528* (2013.01)

(58) Field of Classification Search
CPC .................................................. H01L 51/0097
See application file for complete search history.

(56) References Cited

U.S. PATENT DOCUMENTS 9,460,643 B2 * 10/2016 Hirakata ............. H01F 1/14708
2016/0343969 A1 11/2016 Zeng et al.

FOREIGN PATENT DOCUMENTS

CN 104103662 10/2014
CN 110047881 7/2019

* cited by examiner

*Primary Examiner* — Vip Patel (57) ABSTRACT

The present invention discloses a flexible light emitting display panel, a flexible light emitting display panel manufacturing method, and a display apparatus. The flexible light emitting display panel includes: a substrate, a flexible layer, a light emitting device, polarizer, and a cover lid stacked sequentially on one another from a bottom to a top. The substrate is made of a metal material. The substrate made of the metal material serves as the base of the flexible light emitting display panel can guarantee flexibility characteristics of the flexible light emitting display panel and enhancement of an overall hardness of the flexible light emitting display panel simultaneously.

6 Claims, 7 Drawing Sheets

FLEXIBLE LIGHT EMITTING DISPLAY PANEL, FLEXIBLE LIGHT EMITTING DISPLAY PANEL MANUFACTURING METHOD AND DISPLAY APPARATUS

RELATED APPLICATIONS

This application is a National Phase of PCT Patent Application No. PCT/CN2019/119287 having International filing date of Nov. 18, 2019, which claims the benefit of priority of Chinese Patent Application No. 201910822688.4 filed on Sep. 2, 2019. The contents of the above applications are all incorporated by reference as if fully set forth herein in their entirety.

FIELD AND BACKGROUND OF THE INVENTION

The present invention relates to a field of display technologies, specifically relates to a flexible light emitting display panel, a flexible light emitting display panel manufacturing method, and a display apparatus.

In recent years, with development of display technologies, display apparatus such as cellular phones and tablets are easy to be carried and are accepted by users. Flexible displays, compared to the common displays, have advantages of flexibility and twist and roll such that requirement for large size displays with high resolutions and portability of the devices no longer conflict with each other.

At present, a flexible light emitting display panel because of requirement for maintenance of its flexibility characteristics, is made of a flexible material with excellent flexibility. For example, a cover lid with a comparative low hardness is used for manufacturing the flexible light emitting display panel to form a flexible light emitting display panel with an overall comparative low hardness. However, the over-soft flexible light emitting display panel causes the screen to be sunken or uneven.

Therefore, the conventional art has defects and requires improvement urgently.

SUMMARY OF THE INVENTION

Technical Issue

An embodiment of the present invention provides a flexible light emitting display panel, a flexible light emitting display panel manufacturing method, and a display apparatus that are able to guarantee flexibility characteristics of the flexible light emitting display panel while improving a total hardness of the flexible light emitting display panel.

Technical Solution

In a first aspect, an embodiment of the present invention provides a flexible light emitting display panel, comprising:
a substrate, a flexible layer, a light emitting device, a polarizer, and a cover lid sequentially stacked on one another from a bottom to a top;
wherein the substrate is a substrate made of a metal material.

In the flexible light emitting display panel of the present invention, the flexible light emitting display panel comprises at least one bending region.

In the flexible light emitting display panel of the present invention, at least one gap is defined in the substrate, and the at least one gap is located in the bending region.

In the flexible light emitting display panel of the present invention, at least one recess is defined in a surface of the substrate away from the flexible layer, and the at least one recess is located in the bending region.

In the flexible light emitting display panel of the present invention, a width of the at least one recess is the same as a horizontal width of the bending region of the flexible light emitting display panel in an expanded and flattened status.

In the flexible light emitting display panel of the present invention, the metal material is ductile metal.

In a second aspect, an embodiment of the present invention also provides a flexible light emitting display panel manufacturing method, comprising:
providing a substrate, wherein the substrate is made of a metal material;
coating a flexible layer on the substrate;
forming a light emitting device on the flexible layer; and
attaching a polarizer on the light emitting device.

In the flexible light emitting display panel manufacturing method of the present invention, after the step of attaching the polarizer on the light emitting device, the method further comprises:
patterning a surface of the substrate away from the flexible layer to define at least one gap or recess in the substrate.

In the flexible light emitting display panel manufacturing method of the present invention, the step of patterning the surface of the substrate away from the flexible layer comprises:
etching a portion of the surface of the substrate opposite to a middle region of the flexible layer.

In a third aspect, an embodiment of the present invention also provides a display apparatus, comprising: a flexible light emitting display panel and a casing, the flexible light emitting display panel is disposed on the casing, the flexible light emitting display panel comprises:
a substrate, a flexible layer, a light emitting device, a polarizer, and a cover lid sequentially stacked on one another from a bottom to a top;
wherein the substrate is made of a metal material.

The display apparatus of the present invention, the flexible light emitting display panel comprises at least one bending region.

The display apparatus of the present invention, at least one gap is defined in the substrate, and the at least one gap is located in the bending region.

The display apparatus of the present invention, at least one recess is defined in the surface of the substrate away from the flexible layer, and the at least one recess is located in the bending region.

The display apparatus of the present invention, a width of the at least one recess is the same as a horizontal width of the bending region of the flexible light emitting display panel in an expanded and flattened status.

The display apparatus of the present invention, the metal material is ductile metal.

An embodiment of the present invention also provides a flexible light emitting display panel, comprising:
a substrate, a flexible layer, a light emitting device, a polarizer, and a cover lid sequentially stacked on one another from a bottom to a top;
wherein the substrate is a substrate made of a metal material, the flexible light emitting display panel comprises at least one bending region, and the metal material is ductile metal.

Advantages

The flexible light emitting display panel provided by an embodiment of the present invention comprises: a substrate, a flexible layer, a light emitting device, a polarizer, and a cover lid; wherein the substrate is made of a metal material. By using the substrate made of the metal material to manufacture a base of the flexible light emitting display panel, an overall hardness of the flexible light emitting display panel is improved.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the related art, to fulfill flexibility characteristics during manufacturing flexible light emitting display panel, a flexible material with excellent flexibility characteristic is chosen as a base material for manufacturing the flexible light emitting display panel. Therefore, the flexible layer is coated on a glass substrate, and when the light emitting device is manufactured, the glass substrate needs to be removed by a laser lift off (LLO) process after the array process and electroluminescence assembly (EL) process are completed. However, such LLO process increases risks (panel peeling) and manufacturing costs of the display panel glass. In another aspect, in a flexible light emitting display panel, a material of each layer employs a flexible material with an excellent flexibility characteristic. For example, during manufacturing of a flexible light emitting display panel a cover lid with a comparative low hardness is chosen to form a flexible light emitting display panel with an overall comparative low hardness. However, the over-soft flexible light emitting display panel causes the screen to be sunken or uneven. Moreover, in designs of a carrying mechanism for the flexible light emitting display panel, besides a backplate (BP), a steel plate is required to be attached to a rear of the display panel to be a metal support layer for supporting an overall structure, which makes an overall thickness of the flexible light emitting display panel to be excessive large.

An embodiment of the present invention provide a display apparatus comprising: a flexible light emitting display panel and a casing. The flexible light emitting display panel is disposed on the casing, and the flexible light emitting display panel comprises:

a substrate, a flexible layer, a light emitting device, polarizer, and a cover lid sequentially stacked on one another from a bottom to a top;

wherein the substrate is made of a metal material.

The flexible light emitting display panel comprises at least one bending region.

At least one gap is defined in the substrate, and the at least one gap is in the bending region.

At least one recess is defined in the surface of the substrate away from the flexible layer, and the at least one recess is located in the bending region.

A width of the at least one recess is the same as a horizontal width of the bending region of the flexible light emitting display panel in an expanded and flattened status.

The metal material is a ductile metal.

Figure 1:
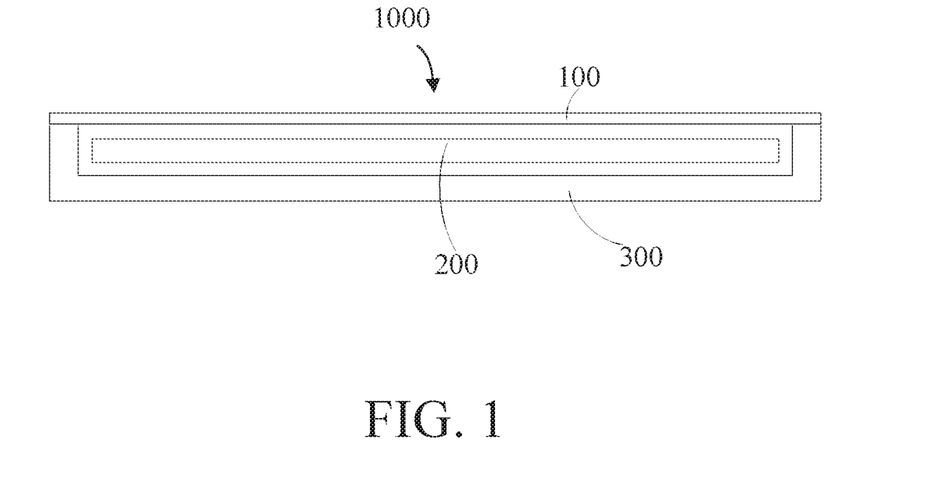
FIG. 1 is a schematic structural view of a display apparatus provided by an embodiment of the present invention.

With reference to FIG. 1, FIG. 1 is a schematic structural view of a display apparatus 1000 provided by an embodiment of the present invention. The display apparatus 1000 can comprise a flexible light emitting display panel 100, a control circuit 200, and a casing 300. It should be explained that the display apparatus 1000 as shown in FIG. 1 is not limited by the above contents and can include other devices such as a camera, an antenna, and a fingerprint unlocking module.

The flexible light emitting display panel 100 is disposed on casing 200. The casing can include a carrier mechanism and a hinge structure of the flexible light emitting display panel 100 (not shown in the figures).

In some embodiment, the flexible light emitting display panel 100 can be fixed on the casing 300, the flexible light emitting display panel 100 and the casing 300 form a hermetic space to accommodate a device such as a control circuit 200.

In some embodiment, the casing 300 can be made of a flexible material, for example, a plastic casing or a silicone casing.

The control circuit 200 is installed in the casing 300, the control circuit 200 can be a mainboard of the display apparatus 1000, the control circuit 200 can be integrated with one, two or several of a battery, an antenna structure, a microphone, a speaker, an audio jack, an universal serial bus port, a camera, a distance sensor, an environment light sensor, a receiver, and a processor.

The flexible light emitting display panel 100 is installed in the casing 300, in the meantime, the flexible light emitting display panel 100 is electrically connected to the control circuit 200 to form a display screen of the display apparatus 1000. The flexible light emitting display panel 100 can comprise a displaying region and a non-displaying region. The displaying region can be used to display a screen of the display apparatus 1000 or can allow a user to implement touch operation. The non-displaying region can be used for disposing various functional assemblies.

An embodiment of the present invention also provides a flexible light emitting display panel manufacturing method comprising:

providing a substrate, wherein the substrate is made of a metal material;

coating a flexible layer on the substrate;

forming a light emitting device on the flexible layer; and attaching a polarizer on the light emitting device.

After the step of attaching the polarizer on the light emitting device, the method further comprises:

patterning a surface of the substrate away from the flexible layer to define at least one gap or recess in the substrate.

The step of patterning the surface of the substrate away from the flexible layer comprises:

etching a portion of the surface of the substrate opposite to a middle region of the flexible layer.

Figure 2:
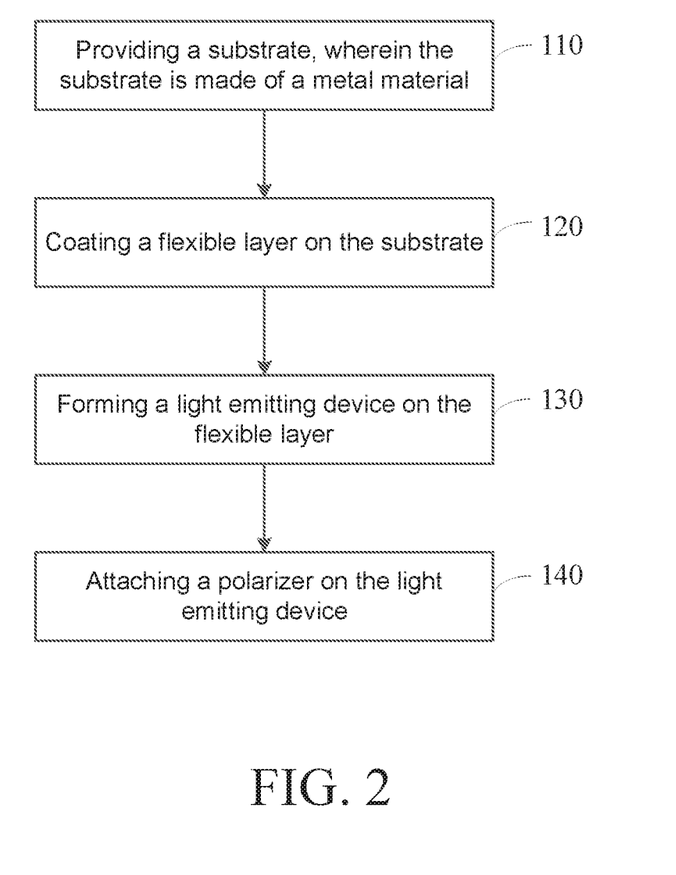
FIG. 2 is a flowchart of a flexible light emitting display panel manufacturing method provided by an embodiment of the present invention.

With reference to FIG. 2, FIG. 2 is a flowchart of a flexible light emitting display panel manufacturing method provided by an embodiment of the present invention. The method comprises steps 110 to 140.

The step 110 comprises providing a substrate 10, and the substrate 10 is made of a metal material.

Figure 3:
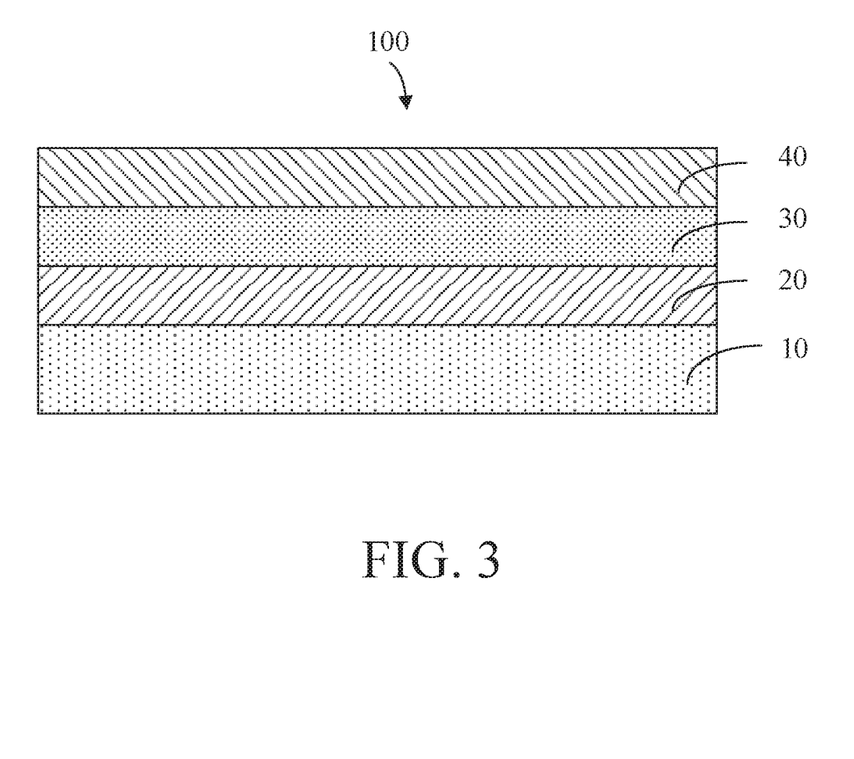
FIG. 3 is a first schematic structural view of a flexible light emitting display panel provided by an embodiment of the present invention.

Specifically, with reference to FIG. 3, FIG. 3 is a first schematic structural view of a flexible light emitting display panel 100 provided by an embodiment of the present invention.

It should be understood that to prevent an overall comparative low hardness of the flexible light emitting display panel 100, the substrate 10 made of the metal material can directly serve as a base of the flexible light emitting display panel 100. In the meantime, to keep flexibility characteristics of the flexible light emitting display panel 100, guarantee of bending and twisting of the substrate 10 is required. Therefore, a metal material for manufacturing the substrate 10 is required to have bendable and stretchable characteristics. Accordingly, the metal material is a ductile metal. Ductility means a deforming ability of a structure of a material, a member, or a certain cross section of the member being deformed to a maximum carrying ability or a carrying ability not decreasing significantly. For example, gold, copper, and aluminum are materials with high ductility.

Specifically, the metal material is one of aluminum (Al) and steel special use stainless (SUS). When the metal material is aluminum, a thickness of the substrate 10 made of aluminum is generally 1 mm. when the metal material is, a thickness of the substrate 10 made of stainless steel is 30 μm. The thickness of the substrate 10 of the metal material is different based on different metals, flexibility characteristics and costs, which will be described repeatedly.

The step 120 comprises coating a flexible layer 20 on the substrate 10.

Specifically, the flexible layer 20 is made generally by making a solution of polyimide (PI), coating the solution on the substrate 10, and then curing the solution with ultraviolet light (UV) to form the flexible layer 20. The flexible layer 20 has excellent thermal durability, electrical insulation, adhesion, radiation durability, etc.

The step 130 comprises forming a light emitting device 30 on the flexible layer 20.

Specifically, the light emitting device 30 can comprise a thin film transistor (TFT), a pixel definition layer, and an anode, a hole transport layer, a light emitting layer, an electron transport layer, and a cathode (all not shown in the figures) that are formed sequentially on a region defined by the pixel definition layer. When a power is supplied to reach an adequate voltage, a hole of the positive electrode combines an electron of the cathode in the light emitting layer to generate light such that red (R), green (G), and blue (B) lights are generated. However, it is not limited to RGB lights, white (W) can be included, which is not limited. Of course, the light emitting device 30 is not only limited to an organic light emitting diode (OLED), and can be a LCD.

The step 140 comprises attaching a polarizer 40 on the light emitting device 30.

Specifically, if the light emitting device 30 is a liquid crystal display (LCD) cell the polarizer 40 is required to be attached to the light emitting device 30, images of the liquid crystal needs polarized light, and the polarizer 40 is configured to scatter reflective light on a surface, and twist a transmitting direction of the polarized light to achieve enhancement of brightness and reduction of color saturation. Generally, the polarizer 40 for the LCD comprises a liquid crystal glass and the polarizers attached to two opposite surfaces of the liquid crystal glass, and therefore a thickness of the polarizer 40 is usually 1 mm.

It should be understood that when the light emitting device 30 is an OLED, to prevent reflection of an external light on the flexible light emitting display panel 100 by metal such as the cathode to affect contrast, a circular polarizer 40 is required to reduce reflection of the cathode or other metal.

Figure 4:
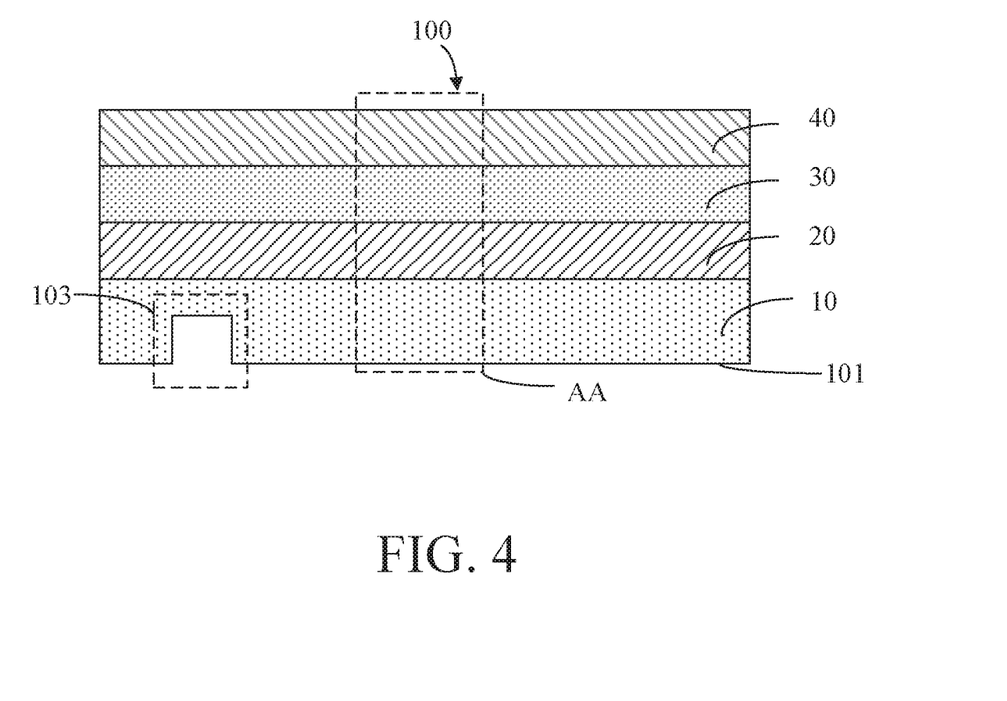
FIG. 4 is a second schematic structural view of a flexible light emitting display panel provided by an embodiment of the present invention.

In some embodiment, with reference to FIG. 4, FIG. 4 is a second schematic structural view of a flexible light emitting display panel 100 provided by an embodiment of the present invention.

Specifically, to prevent that stress generated by the bending flexible light emitting display panel 100 cannot be released, after the step 140, the surface 101 of flexible layer 20 in the substrate 10 is patterned to define at least one gap 102 or recess 103 in the substrate 10. A schematic structural view of the flexible light emitting display panel 100 with the substrate 10 defined with the recess 103 is as shown in FIG. 5, FIG. 5 is a third schematic structural view of a flexible light emitting display panel provided by an embodiment of the present invention.

A patterning process is usually an etching process that etches the surface 101 of the substrate 10 away from the flexible layer 20. A deep etched gap 102 or a shallow etched recess 103 is defined in the surface 101 depending on different etching degrees. Furthermore, a cross section of the recess 103 can be rectangular or curved. Because the flexible light emitting display panel 100 has flexibility characteristics, a bending can be implemented depending on the bending region of the flexible light emitting display panel 100. When the flexible light emitting display panel 100 is limited to be bent through a fixed bending region, the gap 102 or recess 103 to be treated with the etching process is located in bending region. By disposing the gap 102 or recess 103 in the bending region, it is achieved that stress generated from bending the flexible light emitting display panel 100 is released through the gap 102 or the recess 103.

Figure 5:
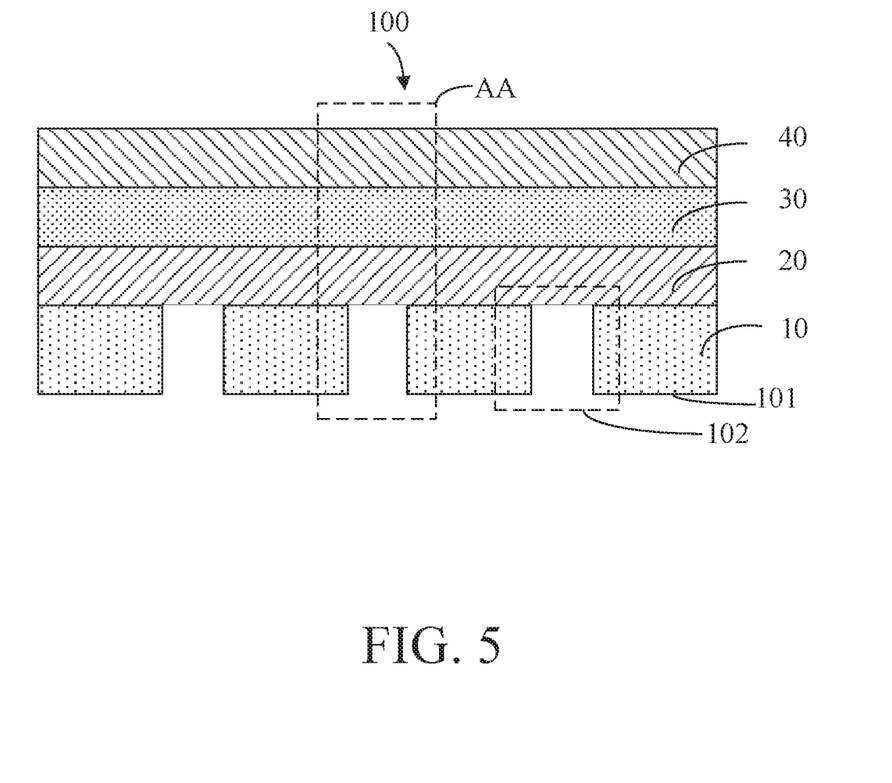
FIG. 5 is a third schematic structural view of a flexible light emitting display panel provided by an embodiment of the present invention.

When a fixed bending region of the flexible light emitting display panel 100 is not limited, in other words, a plurality of light emitting regions can exist on the flexible light emitting display panel 100, as shown in FIG. 5. The user can bend the flexible light emitting display panel 100 on its any place anyplace. In other words, the flexible light emitting display panel 100 comprises at least one bending region AA.

A width of the at least one recess 103 is the same as a horizontal width of the bending region AA of the flexible light emitting display panel 100 in an expanded and flattened status.

Figure 6:
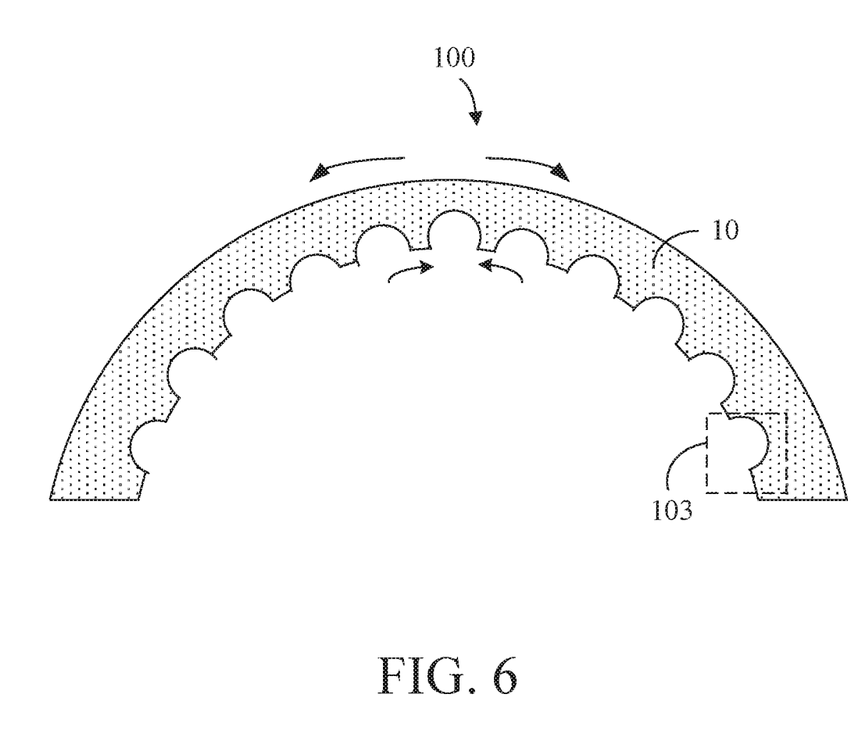
FIG. 6 is a schematic structural view a substrate provided by an embodiment of the present invention.

Specifically, With reference to FIG. 6, FIG. 6 is a schematic structural view a substrate 10 provided by an embodiment of the present invention. For example, at least one recess 103 is defined in the substrate 10 and a cross section of the recess 103 is curved. When the flexible light emitting display panel 100 is bent, the substrate 10 is affected by a bending force to bend, the substrate materials on two sides of the recess 103 is filled into the recess 103, in other words, the recess 103 results in a decreased stress of the substrate material, the decreased compression stress of the substrate material results in a transfer of a stress neutral plane of the flexible light emitting display panel 100 to another layer, for example, an encapsulation layer.

Figure 7:
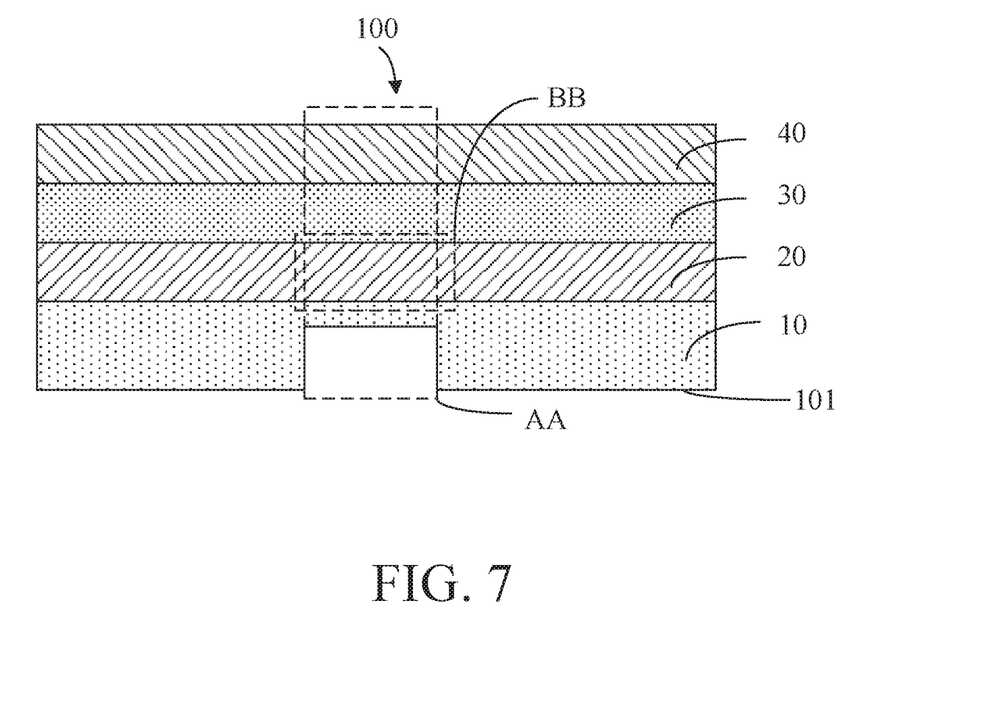
FIG. 7 is a fourth schematic structural view of a flexible light emitting display panel provided by an embodiment of the present invention.

In some embodiment, with reference to FIG. 7, FIG. 7 is a fourth schematic structural view of a flexible light emitting display panel 100 provided by an embodiment of the present invention.

A surface 101 of the substrate 10 opposite to a middle region BB of the flexible layer 20 is etched. It is a circumstance that the bending region AA is located in the middle region of the flexible light emitting display panel 100, i.e., the middle region BB of the flexible layer 20.

An embodiment of the present invention also provides a flexible light emitting display panel, comprising:

a substrate, a flexible layer, a light emitting device, a polarizer, and a cover lid sequentially stacked on one another from a bottom to a top;

wherein the substrate is made of a metal material.

The flexible light emitting display panel comprises at least one bending region.

The at least one gap is defined in the substrate, and the at least one gap is located in the bending region.

At least one recess is defined in the surface of the substrate away from the flexible layer, and the at least one recess is located in the bending region.

A width of the at least one recess is the same as a horizontal width of the bending region of the flexible light emitting display panel in an expanded and flattened status.

The metal material is a ductile metal.

The light emitting display panel provided by an embodiment of the present invention comprises: a substrate, a flexible layer, a light emitting device, a polarizer, and a cover lid sequentially stacked on one another from a bottom to a top. The substrate is made of a metal material. The substrate made of the metal material serves as the base of the flexible light emitting display panel can guarantee flexibility characteristics of the flexible light emitting display panel and enhancement of an overall hardness of the flexible light emitting display panel simultaneously.

An embodiment of the present invention also provides a flexible light emitting display panel comprising:

a substrate, a flexible layer, a light emitting device, a polarizer, and a cover lid sequentially stacked on one another from a bottom to a top;

wherein the substrate is a substrate made of a metal material, the flexible light emitting display panel comprises at least one bending region, and the metal material is ductile metal.

The flexible light emitting display panel, the flexible light emitting display panel manufacturing method, and the display apparatus provided by the embodiment of the present invention are described in detail. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A flexible light emitting display panel, comprising:
   a substrate, a flexible layer, a light emitting device, a polarizer, and a cover lid sequentially stacked on one another from a bottom to a top;
   wherein the substrate is a substrate made of a metal material;
   wherein the flexible light emitting display panel comprises at least one bending region;
   wherein the substrate is formed integrally, at least one recess is defined in a surface of the substrate away from the flexible layer, and the at least one recess is located in the bending region;
   wherein a width of the at least one recess is the same as a horizontal width of the bending region of the flexible light emitting display panel in an expanded and flattened status.

2. The flexible light emitting display panel as claimed in claim 1, wherein a width of the at least one recess is the same as a horizontal width of the bending region of the flexible light emitting display panel in an expanded and flattened status.

3. The flexible light emitting display panel as claimed in claim 1, wherein the metal material is ductile metal.

4. A display apparatus, wherein the display apparatus comprises a flexible light emitting display panel and a casing, the flexible light emitting display panel is disposed on the casing, and the flexible light emitting display panel comprises:
   a substrate, a flexible layer, a light emitting device, a polarizer, and a cover lid sequentially stacked on one another from a bottom to a top;
   wherein the substrate is made of a metal material;
   wherein the flexible light emitting display panel comprises at least one bending region;
   wherein the substrate is formed integrally, at least one recess is defined in the surface of the substrate away from the flexible layer, and the at least one recess is located in the bending region;
   wherein a width of the at least one recess is the same as a horizontal width of the bending region of the flexible light emitting display panel in an expanded and flattened status.

5. The display apparatus as claimed in claim 4, wherein a width of the at least one recess is the same as a horizontal width of the bending region of the flexible light emitting display panel in an expanded and flattened status.

6. The display apparatus as claimed in claim 4, wherein the metal material is ductile metal.

* * * * *